(12) United States Patent
Ryu et al.

(10) Patent No.: US 6,724,799 B2
(45) Date of Patent: Apr. 20, 2004

(54) WAVELENGTH TUNABLE LASER LIGHT SOURCE

(75) Inventors: Sang-wan Ryu, Daejon (KR); Je-ha Kim, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 10/177,955

(22) Filed: Jun. 20, 2002

(65) Prior Publication Data

US 2003/0108081 A1 Jun. 12, 2003

(30) Foreign Application Priority Data

Dec. 12, 2001 (KR) ........................... 2001-78658

(51) Int. Cl.⁷ .............................................. H01S 3/08
(52) U.S. Cl. ......................... 372/102; 372/97; 372/20
(58) Field of Search ............................. 372/102, 97, 20

(56) References Cited

U.S. PATENT DOCUMENTS

| | | | |
|---|---|---|---|
| 4,914,665 A | | 4/1990 | Sorin |
| 5,485,481 A | | 1/1996 | Ventrudo et al. |
| 5,864,574 A | * | 1/1999 | Welch et al. .................. 372/50 |
| 6,084,050 A | * | 7/2000 | Ooba et al. .................... 528/52 |
| 6,295,306 B1 | * | 9/2001 | Asami .......................... 372/20 |
| 6,311,004 B1 | * | 10/2001 | Kenney et al. ............. 385/130 |
| 2003/0016722 A1 | * | 1/2003 | Zimmerman ................ 372/103 |
| 2003/0035459 A1 | * | 2/2003 | Wilson et al. ................. 372/97 |

OTHER PUBLICATIONS

Electronics Letters, Jun. 20, 1991, vol. 27, No. 13, pp. 1115–1116.
IEEE Journal Quantum Electronics, vol. 29, No. 6, Jun. 1993, pp. 1824–1834.
IEEE Journal of Selected Topics in Quantum Electronics, vol. 6, No. 1, Jan./Feb. 2000, pp. 197–206.

* cited by examiner

Primary Examiner—Paul Ip
Assistant Examiner—Leith Al-Nazer
(74) Attorney, Agent, or Firm—Blakely, Sokoloff, Taylor & Zafman

(57) ABSTRACT

A wavelength tunable laser light source necessary for a Wavelength Division Multiplexing (WDM)-based optical communication system, and more particularly, a wavelength tunable laser light source for maintaining a stable wavelength without a wavelength locker is provided. The wavelength tunable laser includes an optical fiber and a semiconductor device. The optical fiber can implement multiple reflection peaks. The semiconductor device includes a mode size converter section, a gain section and a DBR mirror section. One facet of the semiconductor device, which is adjacent to the optical fiber, has an antireflection coating layer. Therefore, the wavelength tunable laser based on an optical fiber containing multiple reflection peaks can maintain excellent wavelength stability insensitive to current injection, temperature, and environments without a wavelength locker.

5 Claims, 4 Drawing Sheets

WAVELENGTH TUNABLE LASER LIGHT SOURCE

BACKGROUND OF THE INVENTION

1. Field of the Invention

The present invention relates to a wavelength tunable laser light source necessary for a Wavelength Division Multiplexing (WDM)-based optical communication system, and more particularly, to a wavelength tunable laser for maintaining a stable wavelength without a wavelength locker.

2. Description of the Related Art

As the amounts of information transmitted over the communication system explosively grow, Wavelength Division Multiplexing (WDM)-based optical communication becomes prevalent for high speeds networks. WDM is a technology that utilizes optical signals having different wavelengths (channels) to be transmitted through a single optical fiber, taking advantage of the non-interactivity of light. Recognized as a powerful and cost-effective optical communication solution, the WDM technology guarantees the scalability and the flexibility of the optical communication system.

In a WDM-based optical communication system, a wavelength tunable laser becomes more important than ever before as a multi-channel light source or a back-up light source. For such applications, the wavelength tunable laser light source should show a good single mode operation (a side mode suppression ratio should be 30 dB or higher), wavelength stability (±5% or less of channel separation), and high output power. In addition, a low cost wavelength tunable laser will be a key device in metro and subscriber networks that are expected to evolve at a rapid pace.

However, an existing wavelength tunable laser has a problem to obtain stable lasing wavelength because it is sensitive to change in current, temperature, and environments. As a solution to the above problem, a wavelength locker is used to monitor the lasing wavelength and adjust the wavelength actively using the monitored value. The wavelength locker has several disadvantages such as high cost, complex packaging process, and need of complex wavelength control circuit. Further, periodical calibrations should be performed to calibrate the change in device module caused by aging of the semiconductor laser diode and of the wavelength control circuit. That is, the expensive wavelength tunable laser including the wavelength locker and a complicated control circuit is not suitable for metro and the subscriber networks in which cost is the main concern.

SUMMARY OF THE INVENTION

To solve the above-described problems, it is an object of the present invention to provide a wavelength tunable laser that is cost-effective and can maintain excellent wavelength stability without a wavelength locker.

To achieve the above object, a wavelength tunable laser light source according to a $1^{st}$ embodiment of the present invention includes:

an optical fiber that implements multiple reflection peaks; and a semiconductor device that contains one facet adjacent to the optical fiber, which has an antireflection coating, and a mode size converter section, a gain section and a distributed Bragg reflector (DBR) mirror section.

By the antireflection coating, the optical fiber and the semiconductor device are optically coupled. So, laser oscillation wavelength is determined by coupled reflection spectra of both the optical fiber and DBR mirror.

In the above embodiment, the semiconductor device can further include a phase control section. The optical fiber contains multiple fiber Bragg gratings or a sampled fiber Bragg grating in order to implement multiple reflection peaks. The DBR mirror section contains a single Bragg grating or a sampled Bragg grating and the reflection peak(s) can be controlled by current injection.

A wavelength tunable laser according to a $2^{nd}$ embodiment includes:

an optical fiber that implements multiple reflection peaks; and a semiconductor device that contains one facet adjacent to the optical fiber, which has an antireflection coating, and a mode size converter section, a gain section and a tunable wavelength filter section.

By the antireflection coating, the optical fiber and the semiconductor device are optically coupled. So, laser oscillation wavelength is determined both by reflection peaks of the optical fiber and filtering curve of tunable wavelength filter section.

In the above embodiment, the semiconductor device can further include a phase control section. The optical fiber contains multiple fiber Bragg gratings or a sampled fiber Bragg gratings in order to implement multiple reflection peaks. The variable wavelength filter section has a coupled optical waveguide for filter operation.

A wavelength tunable laser light source according to a $3^{rd}$ embodiment of the present invention includes:

an optical fiber that implements multiple reflection peaks;

a semiconductor device that contains one facet adjacent to the optical fiber, which has an antireflection coating, and a gain section and a DBR mirror section; and a lens for being positioned between the optical fiber and the semiconductor device.

By the antireflection coating, the optical fiber and the semiconductor device are optically coupled. The coupling efficiency between them is improved by the incorporation of the lens. So, laser oscillation wavelength is determined by coupled reflection spectra of both the optical fiber and DBR mirror.

In the above embodiment, the semiconductor device can further include a phase control section. The optical fiber contains multiple fiber Bragg gratings or a sampled fiber Bragg grating in order to implement multiple reflection peaks. The DBR mirror section contains a single Bragg grating or a sampled Bragg grating and the reflection peak(s) can be controlled by current injection.

A wavelength tunable laser light source according to a $4^{th}$ embodiment of the present invention includes:

a silica Passive Lightwave Circuit (PLC) that implements multiple reflection peaks by multiple Bragg gratings or a sampled Bragg grating in a waveguide realized on PLC; and a semiconductor device that is flip-chip bonded on the PLC substrate, that contains one facet adjacent to the waveguide of the silica PLC, and the facet has an antireflection coating, and a mode size converter section, a gain section and a DBR mirror section.

By the antireflection coating, the PLC waveguide and the semiconductor device are optically coupled. So, laser oscillation wavelength is determined by coupled reflection spectra of both the PLC waveguide and DBR mirror.

In the above embodiment, the semiconductor device can further include a phase control section. The optical fiber contains multiple fiber Bragg gratings or a sampled fiber Bragg grating in order to implement multiple reflection peaks. The DBR mirror section contains a single Bragg grating or a sampled Bragg grating and the reflection peak(s) can be controlled by current injection.

With the embodiments described above, a cost-effective and highly wavelength stable wavelength tunable laser could be realized without a wavelength locker and a complex controlling circuit.

BRIEF DESCRIPTION OF THE DRAWINGS

The above objectives and advantages of the present invention will become clearer by describing preferred embodiments in detail with reference to the attached drawings in which.

DETAILED DESCRIPTION OF THE INVENTION

Figure 1:
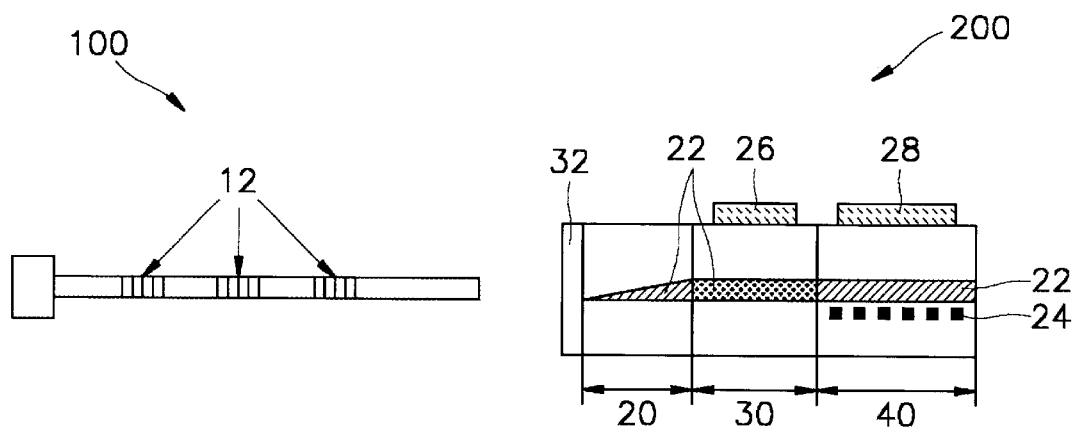
FIG. 1 shows a wavelength tunable laser according to a $1^{st}$ embodiment of the present invention.

The present invention will now be described in detail by describing preferred embodiments thereof with reference to the accompanying drawings. Although specific embodiments of the invention will be described herein for illustrative purposes, various modifications and equivalents thereof can be made without departing from the spirit and scope of the invention, as will be recognized by those skilled in the relevant art. Accordingly, the invention is not limited to the disclosure, but instead its scope is to be determined entirely by the following claims. In the drawings, the same reference marks denote the same elements.

FIG. 1 shows a wavelength tunable laser according to a $1^{st}$ embodiment of the present invention.

With reference to FIG. 1, the wavelength tunable laser of the present invention includes an optical fiber 100 and a semiconductor device 200 that are optically coupled. The optical fiber 100 includes Bragg gratings 12 for multiple reflection peaks. The Bragg gratings 12 of the optical fiber 100 are either multiple fiber Bragg gratings or a sampled fiber Bragg grating. The multiple fiber Bragg gratings are formed on the optical fiber 100 with different center wavelengths. On the contrary, the sampled fiber Bragg grating is periodic gratings separated by no-grating regions on the optical fiber 100.

The semiconductor device 200 is composed of a mode size converter section 20, a gain section 30 and a DBR mirror section 40. All the sections have an optical waveguide 22 for optical mode confinement. The mode size converter section 20 enhances the efficiency of the optical coupling between the semiconductor device 200 and the optical fiber 100 by matching mode size of a laser beam with the optical fiber 100. The gain section 30 amplifies a reflected light by injecting currents through the gain section electrode 26. The DBR mirror section 40 includes a Bragg grating 24, which reflects emitted light at the Bragg wavelength. By injecting current through the DBR mirror electrode 28, the Bragg wavelength can be controlled.

An antireflection coating layer 32 is formed on the left facet of the semiconductor device 200, which is adjacent to the optical fiber 100. The antireflection coating layer 32 prevents a laser resonance from occurring in the semiconductor device 200. Therefore, a laser resonator is formed between the DBR mirror section 40 of the semiconductor device 200 and the optical fiber 100 that includes fiber Bragg gratings 12. On the right facet of the semiconductor device 200, no coating can be used or a high reflection coating can be formed to enhance the efficiency.

FIGS. 2(A) through 2(C) are conceptual diagrams showing the operation principle of the wavelength tunable laser shown in FIG. 1.

More specifically, FIG. 2(A) shows the reflection spectrum of the optical fiber 100 that emits multiple reflection peaks. FIG. 2(B) shows the reflection spectrum of the semiconductor device 200. With reference to FIG. 2(B), solid lines, dotted lines and dash lines indicate the reflection peaks that vary with current injection into the DBR mirror section 40 in the semiconductor device 200.

As a result, lasing action occurs only when the Bragg wavelength of the DBR mirror section 40 matches with one of the multiple reflection peaks of the optical fiber 100. That is, the lasing wavelength may be one of the peak wavelengths shown in FIG. 2(A). If the reflection peaks of the optical fiber 100 are designed to match with channel wavelengths in a wavelength division multiplexing-based communication system, stable wavelengths can be obtained as needed without a wavelength locker.

The advantage of the invention looks quite clear. The center wavelength of the fiber Bragg gratings on the optical fiber 100 has a temperature dependence of 0.01 nm/° C. which is smaller than 0.1 nm/° C. of a semiconductor device. So, the drift of lasing wavelength is smaller than that of the semiconductor device by $\frac{1}{10}$. In addition, if an athermal packaging is incorporated in the optical fiber 100, the temperature dependence can be reduced so that the change of the center frequency is 40 pm or less between −10° C. and 70° C. Furthermore, there is neither current injection nor heat generation that changes refractive index of the optical fiber 100. Therefore, the wavelength tunable laser according to the present invention is advantageous in that it can support excellent wavelength stability by the coupled laser cavity and small temperature dependence of the fiber Bragg grating.

Figure 3:
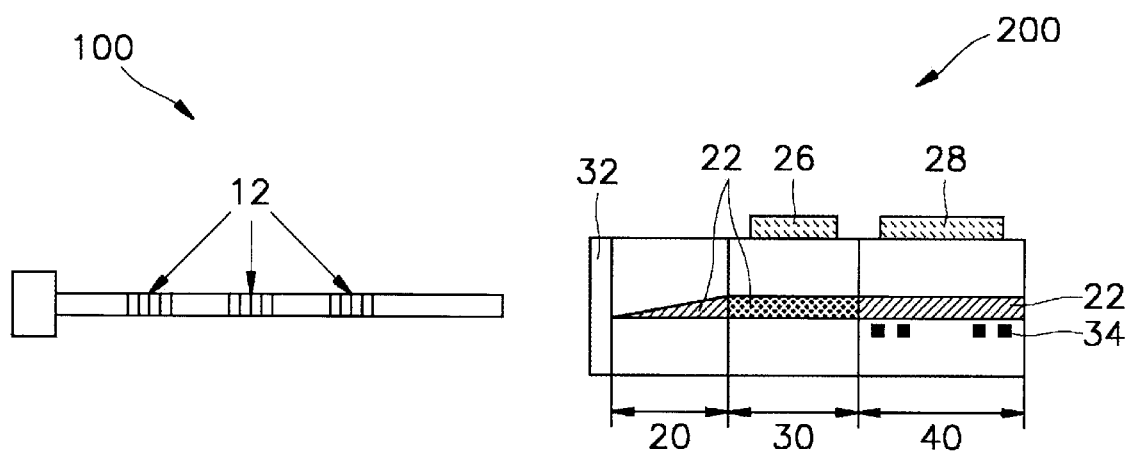
FIG. 3 shows a wavelength tunable laser according to a $2^{nd}$ embodiment of the present invention.

FIG. 3 shows a wavelength tunable laser light source according to a $2^{nd}$ embodiment of the present invention.

To be more specific, the wavelength tunable laser according to a $2^{nd}$ embodiment of the present invention is the same as that according to a $1^{st}$ embodiment of the present invention except that the Bragg grating in the DBR mirror section 40 is sampled Bragg gratings 34. The sampled Bragg grating 34 also has multiple reflection peaks. The separation between the reflection peaks emitted by the sampled Bragg grating 34 should be a little wider or narrower than that between the reflection peaks of the optical fiber 10.

FIGS. 4(A) through 4(C) are conceptual diagrams showing the operation principle of the wavelength tunable laser light source shown in FIG. 3.

More specifically, FIG. 4(A) shows the reflection spectrum of the optical fiber 100 that emits multiple reflection peaks. FIG. 4(B) shows the reflection spectrum of the semiconductor device 200. The separation between reflection peaks emitted by the optical fiber 100 is different from that between the reflection peaks emitted by the semiconductor device 200. Therefore, moving all the reflection peaks of the semiconductor device 200 by injecting current into the DBR mirror section 40 enables one wavelength of the reflection peaks of the semiconductor device 200 to match that of the reflection peaks of the optical fiber 100. In that case, a laser operation occurs at the matched wavelength.

In addition, if the current into the DBR mirror section 40 is controlled, all the reflection peaks are moved and lasing wavelength can be tuned as we implemented. As the reflection peaks emitted by the semiconductor device 200 are moved, the wavelength that matches to the reflection peaks of the optical fiber is also changed. As a result, as shown in FIG. 4(C), the laser operation occurs at a certain wavelength.

Figure 5:
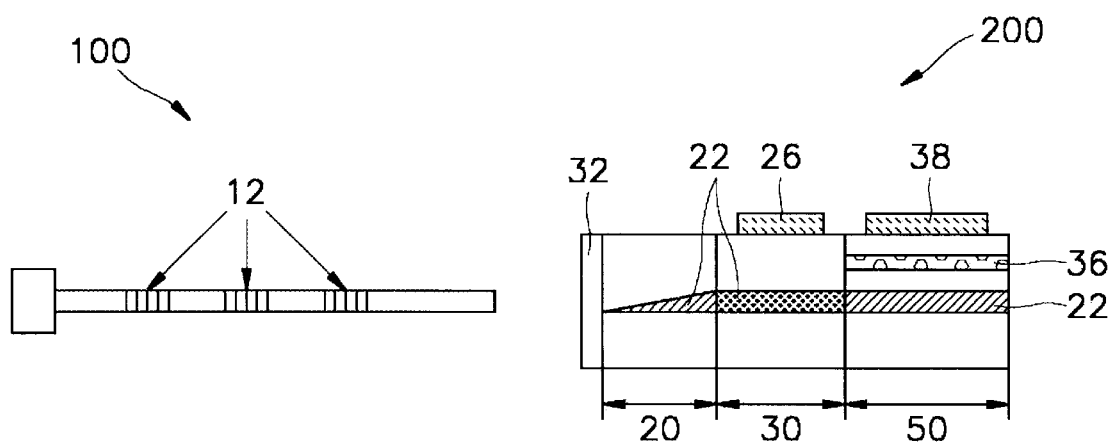
FIG. 5 shows a wavelength tunable laser according to a $3^{rd}$ embodiment of the present invention.

FIG. 5 shows a wavelength tunable laser according to a 3$^{rd}$ embodiment of the present invention.

Specifically, in the 3$^{rd}$ embodiment of the present invention, the DBR mirror sections 40 shown in the 1$^{st}$ and the 2embodiments are replaced by a tunable wavelength filter section 50. The tunable wavelength filter section 50 admits only one reflection peak of the reflection spectrum of the fiber reflected and returned by the right facet, so lasing operation occurs at that wavelength in the same principle as described in FIG. 2(A) through FIG. 2(C). With reference to FIG. 5, the reference number 36 indicates a coupled optical waveguide. The reference number 38 is an electrode for injecting current into the variable wavelength filter section 50.

Figure 6:
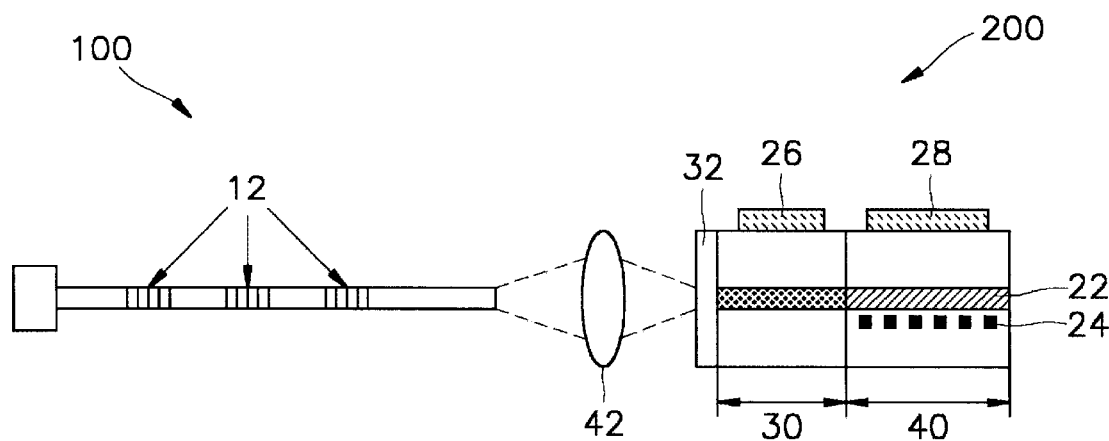
FIG. 6 shows a wavelength tunable laser according to a $4^{th}$ embodiment of the present invention.

FIG. 6 shows a wavelength tunable laser according to a 4$^{th}$ embodiment of the present invention.

More specifically, the 4embodiment is the same as the 1$^{st}$ embodiment except that a lens 42 is used for optical coupling between the optical fiber and the semiconductor device instead of the mode size converter section. That is, in the 4$^{th}$ embodiment of the present invention, a semiconductor device 200 includes a gain section 30 and a DBR mirror section 40. The Bragg gratings 12 of the optical fiber 100 are either multiple fiber Bragg gratings or a sampled fiber Bragg grating same as the 1$^{st}$ embodiment.

Figure 7:
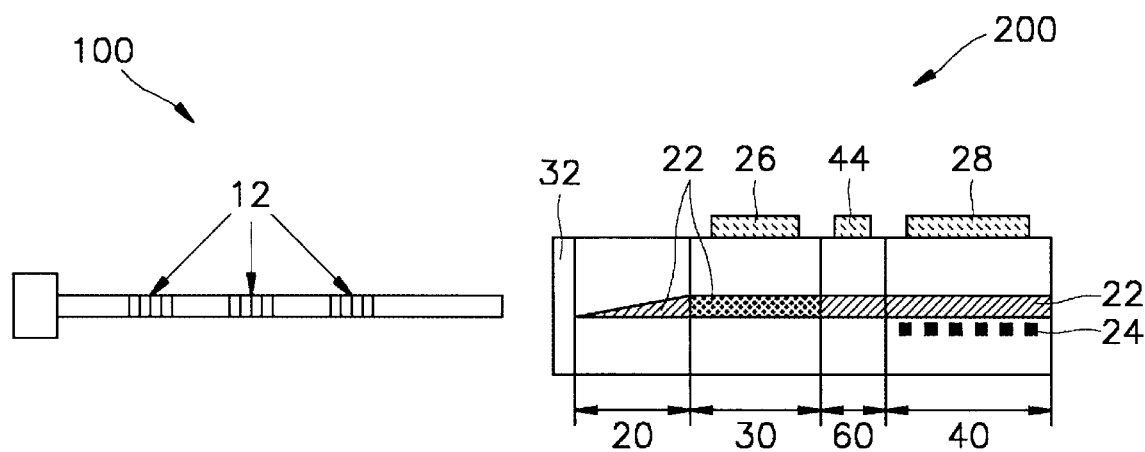
FIG. 7 shows a wavelength tunable laser according to a $5^{th}$ embodiment of the present invention.

FIG. 7 shows a wavelength tunable laser light source according to a 5$^{th}$ embodiment of the present invention.

More specifically, the 5$^{th}$ embodiment of the present invention is the same as the 1$^{st}$ embodiment except a phase control section 60 is added to the semiconductor device 200. Since the wavelength tunable laser according to the 5$^{th}$ embodiment incorporates the phase control section 60, it can perform fine control of the laser characteristics.

The phase control section 60 can be applied to the 2$^{nd}$, the 3$^{rd}$ and the 4$^{th}$ embodiments. The Bragg gratings 12 of the optical fiber 100 are either multiple fiber Bragg gratings or a sampled fiber Bragg grating same as the 1$^{st}$ embodiment. In FIG. 7, the reference number 44 indicates an electrode to inject currents to the phase adjustment section 60.

Figure 8:
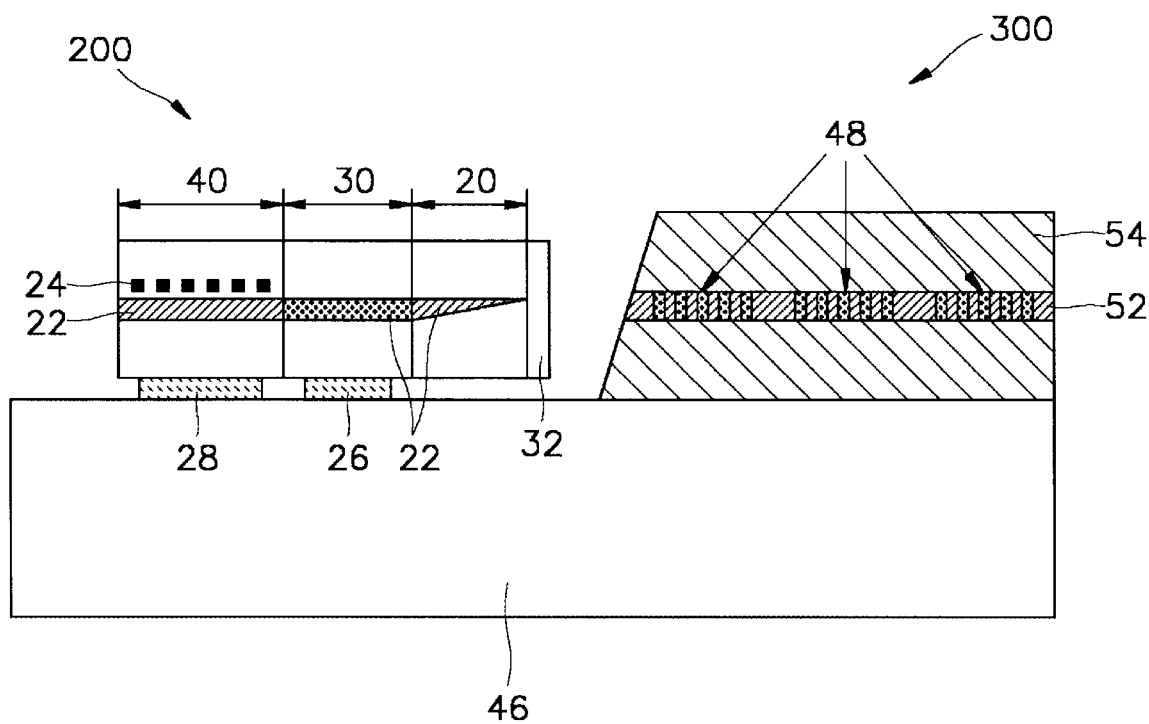
FIG. 8 shows a wavelength tunable laser according to a $6^{th}$ embodiment of the present invention.

FIG. 8 shows a wavelength tunable laser according to a 6$^{th}$ embodiment of the present invention.

Specifically, the 1$^{st}$ embodiment through the 5$^{th}$ embodiment of the present invention adopt an optical fiber 100 to realize multiple reflection peaks. The 6$^{th}$ embodiment of the present invention is the same as the 1$^{st}$ embodiment except that it adopts a silica Passive Lightwave Circuit (PLC) 300 which has the same material properties as the optical fiber 100.

The silica PLC 300 is a technology that forms a thin oxide film on a silicon substrate 46 and forms a waveguide that has the same material property as the optical fiber 100. The silica PLC 300 is composed of a core layer 52 and a clad layer 54 of the optical waveguide on the silicon substrate 46, and Bragg gratings are formed 48 on the PLC waveguide. To fabricate a waveguide on PLC 300, the core layer 52 should have a larger refractive index than that of the clad layer 54, which is realized by impurity doping such as boron, phosphorus and fluorine during the deposition of silicon oxide film. The Bragg gratings 48 may be either multiple Bragg gratings or sampled Bragg gratings in order to implement multiple reflection peaks.

Figure 2:
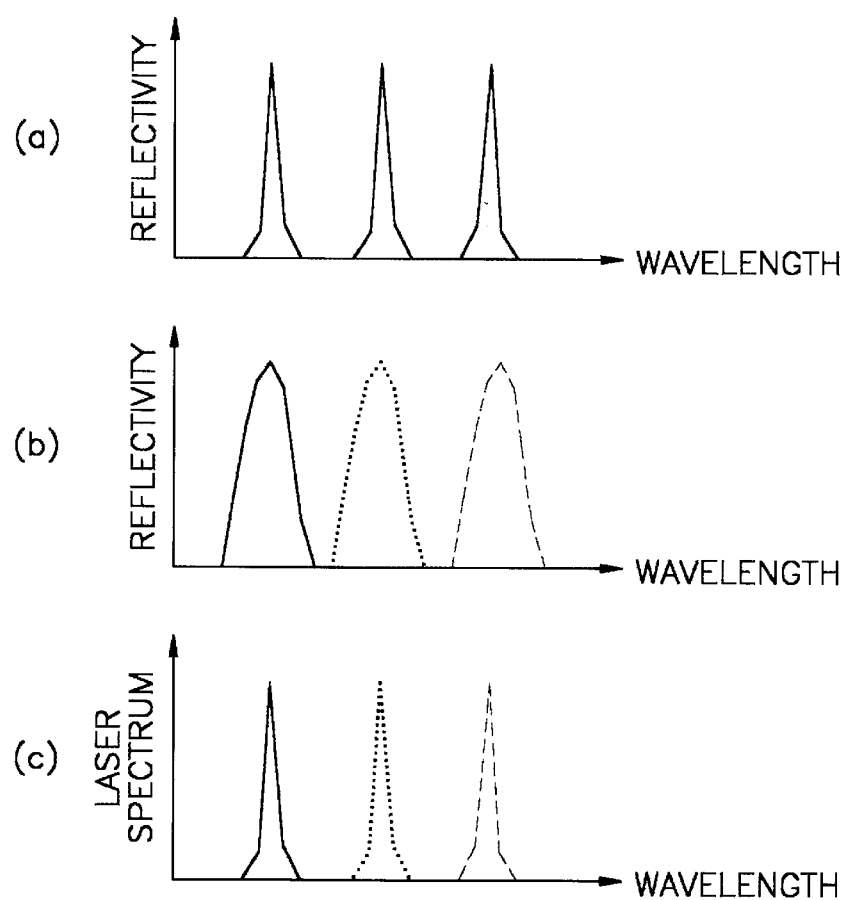
FIGS. 2(A) through 2(C) are conceptual diagrams showing the operation principle of the wavelength tunable laser shown in FIG. 1.
Figure 4:
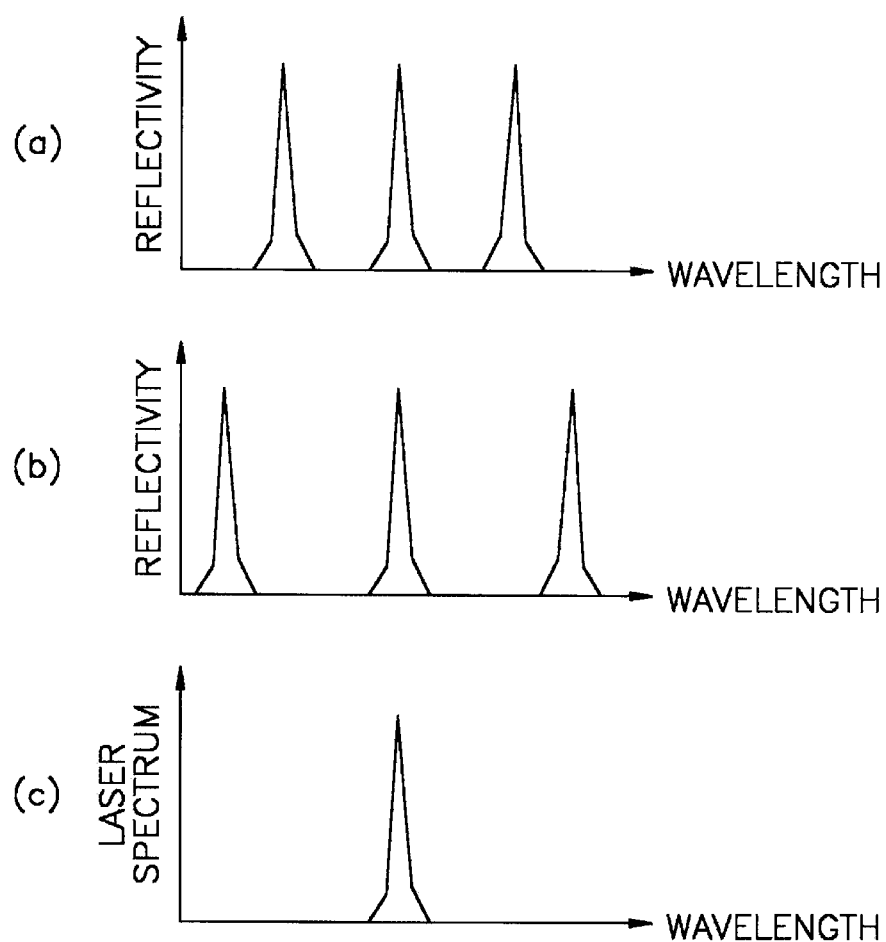
FIGS. 4(A) through 4(C) are conceptual diagrams showing the operation principle of the wavelength tunable laser shown in FIG. 3.

Coupling the silica PLC 300 with the semiconductor device 200 which has an antireflection coating layer 32 adjacent to the PLC waveguide can form the wavelength tunable light source in the same principle as described in FIGS. 2 and 4. That is, the semiconductor device including the mode size converter section 20, the gain section 30 and the DBR mirror section 40 can be flip-chip bonded on the silica substrate 46 by a passive optical alignment. Furthermore, since the silica PLC 300 is a plane type formed on the silica substrate 46, it can be attached to a thermoelectric cooler easily unlike the optical fiber 100. The semiconductor device 200 shown in FIG. 8 can be the same as that shown in the 1$^{st}$ embodiment through the 5$^{th}$ embodiment.

As described above, the wavelength tunable laser of the present invention is cost-effective and maintains high wavelength stability without the wavelength locker that actively controls the wavelength.

Moreover, since the optical fiber stabilizes the oscillation wavelength of the laser, the wavelength tunable laser light source of the present invention can guarantee stable laser oscillation wavelength not sensitive to the temperature, currents and surrounding environments.

What is claimed is:

1. A wavelength tunable laser light source comprising:
   a silica Passive Lightwave Circuit (PLC) including multiple reflection peaks formed by multiple Bragg gratings or a sampled Bragg grating in a waveguide at a location of a PLC substrate;
   and a semiconductor device that is flip-chip bonded on the PLC substrate, the semiconductor device containing a DBR mirror section, a gain section, a mode size converter section, and one facet adjacent to the waveguide of the silica PLC having an antireflection coating;
   wherein the PLC waveguide and the semiconductor device are optically coupled such that the laser oscillation wavelength may be determined by coupled reflection spectra of both the PLC waveguide and the DBR mirror section.

2. The wavelength tunable laser light source of claim 1, wherein the semiconductor device further includes a phase control section.

3. The wavelength tunable laser light source of claim 1, wherein the DBR mirror section includes multiple Bragg gratings or sampled Bragg gratings in order to tune the laser oscillation wavelength.

4. The wavelength tunable laser light source of claim 1, wherein the waveguide of the silica PLC includes multiple Bragg gratings or sampled Bragg gratings in order to implement multiple reflection peaks.

5. A method of tuning a wavelength tunable laser light source comprising:

forming multiple reflection peaks according to multiple Bragg gratings or a sampled Bragg grating in a waveguide at a location of a silica Passive Lightwave Circuit (PLC) substrate;

optically coupling a PLC waveguide to a DBR mirror section of a semiconductor device that is flip-chip bonded on the PLC substrate, the semiconductor device containing a DBR mirror section, a gain section, a mode size converter section, and one facet adjacent to the waveguide of the silica PLC having an antireflection coating;

determining a laser oscillation wavelength according to coupled reflection spectra of both the PLC waveguide and the DBR mirror section.

* * * * *